April 18, 1967 D. J. CARLSON ET AL 3,315,096

ELECTRICAL CIRCUIT INCLUDING AN INSULATED-GATE FIELD EFFECT TRANSISTOR HAVING AN EPITAXIAL LAYER OF RELATIVELY LIGHTLY DOPED SEMICONDUCTOR MATERIAL ON A BASE LAYER OF MORE HIGHLY DOPED SEMICONDUCTOR MATERIAL FOR IMPROVED OPERATION AT ULTRA-HIGH FREQUENCIES

Filed Feb. 17, 1964

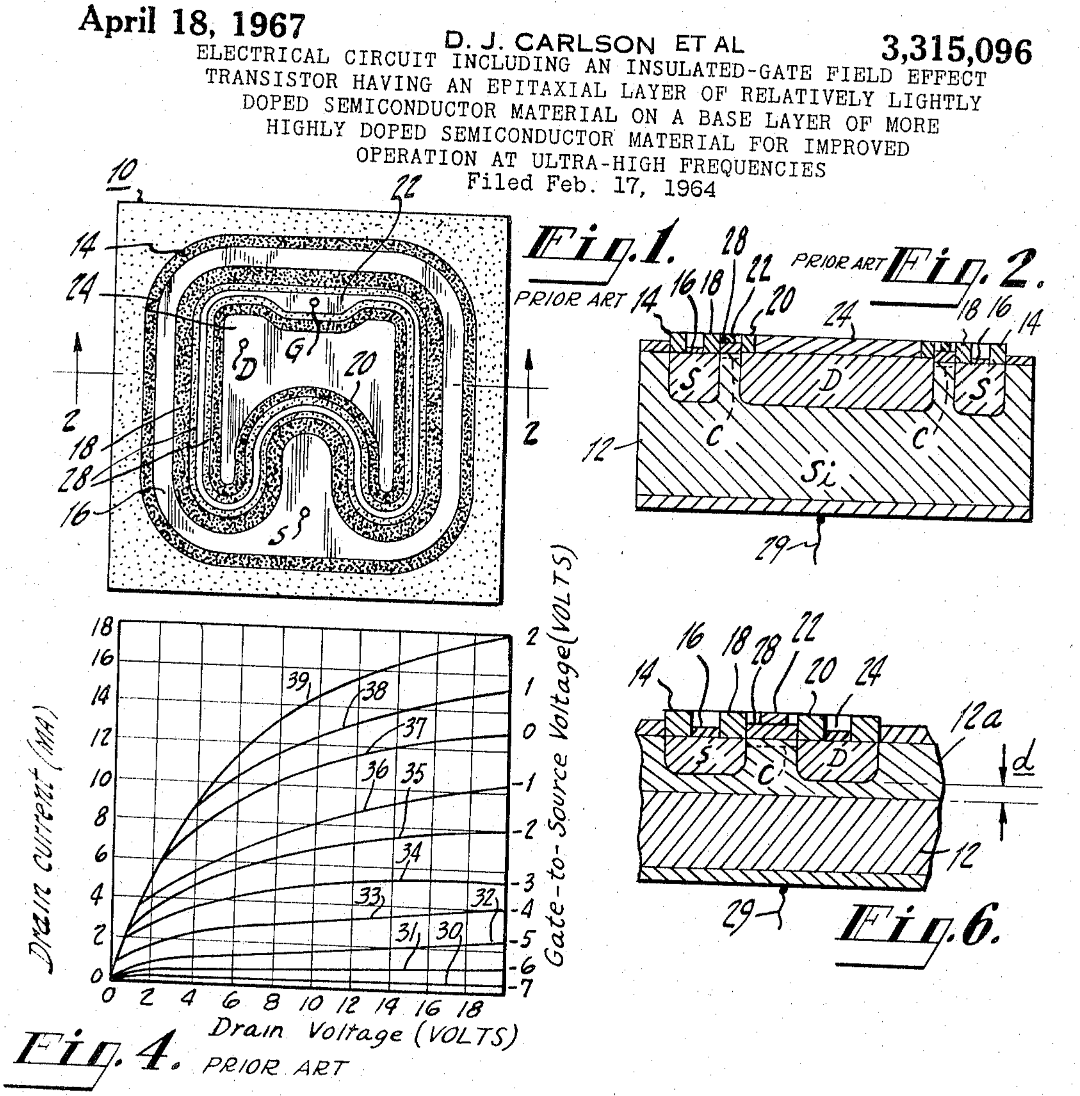
FIG. 1 (PRIOR ART), FIG. 2 (PRIOR ART), FIG. 4 (PRIOR ART), FIG. 6

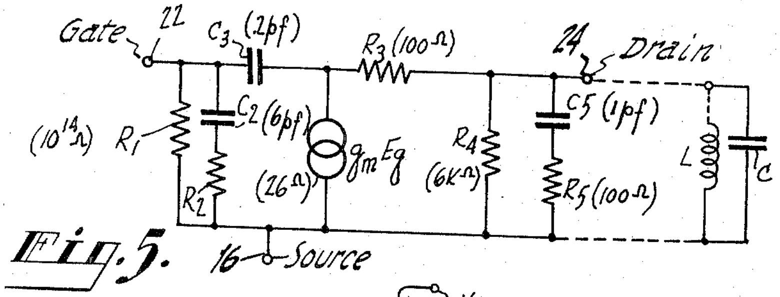
FIG. 5

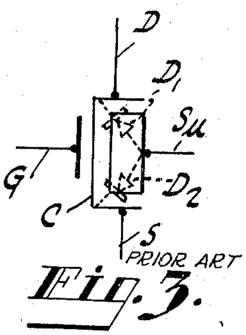
FIG. 3 (PRIOR ART)

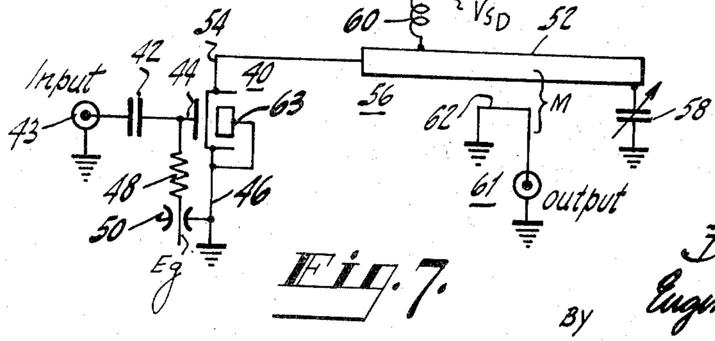
FIG. 7

INVENTORS
David J. Carlson &
Daniel H. Rauscher

BY Eugene M. Whitacre

Attorney

United States Patent Office 3,315,096

Patented Apr. 18, 1967

3,315,096

ELECTRICAL CIRCUIT INCLUDING AN INSULATED-GATE FIELD EFFECT TRANSISTOR HAVING AN EPITAXIAL LAYER OF RELATIVELY LIGHTLY DOPED SEMICONDUCTOR MATERIAL ON A BASE LAYER OF MORE HIGHLY DOPED SEMICONDUCTOR MATERIAL FOR IMPROVED OPERATION AT ULTRA-HIGH FREQUENCIES

David John Carlson, Indianapolis, Ind., and Daniel H. Rauscher, Lebanon, N.J., assignors to Radio Corporation of America, a corporation of Delaware Filed Feb. 17, 1964, Ser. No. 345,365
13 Claims. (Cl. 307—88.5)

This invention relates to electrical circuits employing semiconductor devices and more particularly relates to high frequency tuned electrical circuits employing insulated-gate field-effect semiconductor devices and to a device especially useful in said circuit.

It is an object of this invention to provide an improved high frequency electrical circuit incorporating insulated-gate field-effect semiconductor devices.

It is another object of the invention to provide a semiconductor device especially useful at high frequencies.

A further object of this invention is to provide improved electrical circuits such as amplifier and oscillators which exhibit good performance characteristics at frequencies approaching a kilomegacycle.

It is still a further object of this invention to provide an improved tunable amplifier circuit which provides good noise and gain performance over a wide range of UHF frequencies.

Signal translating circuits using insulated-gate field-effect transistors, such as oscillators and amplifiers, have been operated successfully at high frequencies. However, as the frequencies are increased, the gain and hence the signal-to-noise ratio of these circuits decrease. In the investigation of the high frequency performance of circuits using insulated-gate field-effect transistors, it was discovered that one factor limiting the frequency response appeared to result from unexpected stray circuit paths in the transistor itself. More specifically, the capacitance between the drain electrode and the substrate in series with a resistance of the substrate to the source electrode appears to be at least in part responsible for restricting the frequency range of circutis using the insulated-gate field-effect transistor. At those frequencies where the drain-substrate capacitance comprises a material part of the total capacitance of the output circuit, this series resistance of the substrate, plays a significant role in reducing the Q and hence the impedance of the output circuit. As the impedance of the output circuit is thus reduced, the degree of mismatch of the output circuit to the drain resistance of the insulated-gate field-effect transistor increases thereby decreasing the overall circuit gain.

An ultra high frequency circuit and device embodying the invention includes a special type of insulated-gate field-effect transistor connected as the active element of the circuit. The particular transistor used has source and drain regions formed in an epitaxial layer of relatively lightly doped semiconductor material grown on a base layer of more highly doped semiconductor material. A gate electrode is disposed on an insulating layer overlying the space between the source and drain regions. Circuit means are coupled between the various electrodes for biasing said insulated-gate field-effect transistor to a desired point in its voltage-current characteristic. A tuned output circuit which may comprise a tunable resonant transmission line is connected between the output and common electrodes for deriving output signals.

The transistor construction is such as to reduce the resistance of the substrate which is in series with the drain-to-substrate capacitance mentioned above. At higher frequencies where this drain-to-substrate capacitance becomes a material part of the total capacitance of the tuned output circuit, a material portion of the capacitor current components of the tuned circuit flow through the bulk resistance. However, since the series bulk resistance is low relative to the corresponding resistance in devices used in prior circuits, the damping effect on the tuned circuit Q is less. Accordingly, the high frequency performance of the circuit is improved.

The novel features which are considered to be characteristic of the invention are set forth in particularity in the appended claims. The invention itself, however, both as to its organization and method of operation as well as additional objects and advantages thereof will best be understood from the accompanying drawings in which:

FIGURE 1 is a diagrammatic plan view of an insulated-gate field-effect transistor;

FIGURE 2 is a cross section view taken along section line 2—2 of FIGURE 1;

FIGURE 3 is a symbolic representation of an insulated-gate field-effect transistor;

FIGURE 4 is a graph showing a family of drain current versus drain voltage curves for various values of gate-to-source voltages for the transistor of FIGURE 1;

FIGURE 5 is an equivalent circuit diagram of the transistor shown in FIGURE 1;

FIGURE 6 is a cross sectional view, similar to the one shown in FIGURE 2, of a transistor used in circuits embodying the invention; and FIGURE 7 is a schematic circuit diagram of an ultra high frequency amplifier circuit embodying the invention.

Reference is now made to FIGURE 1 of the drawings which is a diagrammatic plan view of a typical insulated-gate field-effect transistor 10, which is similar to the Type TA2330 sold by the Radio Corporation of America. The transistor 10 includes a substrate or body 12 of semiconductor material which may be either a single crystal or polycrystalline and may be of any of the semiconductor materials used to prepare transistors in the semiconductor art. For example, the body 12 may be nearly intrinsic silicon, such as, for example, lightly doped P-type silicon of 100-ohm-cm. material.

In the manufacture of the device shown in FIGURE 1 heavily doped silicon dioxide is deposited over the surface of the silicon body 12. The silicon dioxide is doped with N-type impurities. By means of a photo-resist and acid etching, or other suitable technique, the silicon dioxide is removed where a gate electrode is to be formed, and around the outer edges of the silicon wafer as viewed on FIGURE 1. The deposited silicon dioxide is left over those areas where the source-drain regions are to be formed.

The body 12 is then heated in a suitable atmosphere, such as in water vapor, so that exposed silicon areas are oxidized to form grown silicon dioxide layers indicated by the lightly stippled areas of FIGURE 1. During the heating process, impurities from the deposited silicon dioxide layers diffuse into the silicon body 12 to form the source and drain regions. FIGURE 2, which is a cross section view taken along section 2—2 of FIGURE 1, shows the source-drain regions labelled S and D respectively.

By means of another photo-resist and acid etching or like step, the deposited silicon dioxide over part of the source-drain diffused regions is removed. Electrodes are formed for the source, drain and gate regions by evaporation of a conductive material by means of an evaporation mask. The conductive material evaporated may be chromium and gold in the order named, for example, but other suitable metals may be used.

The finished wafer is shown in FIGURE 1, in which the lightly stippled area between the outside boundary and the first darker zone 14 is grown silicon dioxide. The white area 16 is the metal electrode corresponding to the source electrode. Dark or more heavily stippled zones 14 and 18 are deposited silicon dioxide zones overlying the diffused source region, and the dark zone 20 is a deposited silicon dioxide zone overlying the diffused drain region. White areas 22 and 24 are the metallic electrodes which correspond to the gate and drain electrodes respectively. The stippled zone 28 is a layer of grown silicon dioxide on a portion of which the gate electrode 22 is placed and which insulates the gate electrode 22 from the substrate silicon body 12 and from the source and drain electrodes as shown in FIGURE 2.

The silicon wafer is mounted on a conductive base or header 26 as shown in FIGURE 2. The input resistance of the device at low frequencies is of the order of $10^{14}$ ohms. The layer of grown silicon dioxide 28 which the gate electrode 22 is mounted, overlies an inversion layer or conductive channel C connecting the source and drain regions. The gate electrode 22 is placed symmetrically between the source region S and the drain region D. If desired, the gate electrode 22 may be displaced towards the source region and may overlap the deposited silicon dioxide layer 18.

Reference is now made to FIGURE 2 of the drawings. The boundaries separating the source and drain regions S and D and the body of silicon substrate 12 effectively operate as a pair of rectifying junctions coupling the silicon substrate 12 to the source and drain electrodes 16 and 24, in such a manner that a bias voltage applied to the substrate 12, which is negative with respect to the voltage of the drain and source electrodes 16 and 24, renders the rectifying junctions nonconductive, i.e., reverse biased. In other words, the substrate acts as the anode electrode of these rectifying junctions.

By reverse biasing the rectifying junctions a capacitance effect may be obtained. When reverse biased, each of the rectifying junctions exhibits a capacitance, the value of which is a function of the reverse biasing voltage and the junction area. Thus, the magnitude of the capacitance exhibited by the rectifying junctions may be determined during the manufacture by selecting the size of the junction area. The limitation, however, is that the variation in junction area should be within a range in which other desirable characteristics of the insulated-gate field-effect transistor are maintained.

FIGURE 3 is a symbolic representation of the insulated-gate field-effect transistor previously described in FIGURES 1 and 2. There is shown the gate electrode G, the drain electrode D, the source electrode S, and the substrate of semiconductor material $S_u$. It should be noted that electrodes D and S operate as the drain and source electrodes as a function of the polarity of the bias potential applied therebetween; i.e., the electrode to which a positive bias potential is applied (relative to the bias potential applied to the other electrode) operates as a drain electrode, and the other electrode operates as a source electrode.

The drain and source electrodes are connected to each other by a conductive channel C. The majority current carriers (in this case electrons) flow from source-to-drain in this thin channel region close to the surface. The conductive channel C is shown in FIGURE 2 in dotted lines.

The source and drain regions S and D shown in FIGURE 2 are in rectifying contact with the substrate 12, illustrated in FIGURE 3 by a pair of rectifying junctions $D_1$ and $D_2$ respectively. The anode electrodes of the rectifying junctions $D_1$ and $D_2$ are at the substrate $S_u$ and the cathode electrodes of rectifying junctions $D_1$ and $D_2$ are respectively at the source and drain electrodes S and D. If the body 12 of semiconductor material is lightly doped N-type silicon, and the source and drain regions are doped with P-type impurities, the rectifying junctions $D_1$ and $D_2$ are poled opposite to the way shown in FIGURE 3; i.e., the cathode electrodes of rectifying junctions $D_1$ and $D_2$ are then at the substrate $S_u$.

FIGURE 4 is a family of curves 30–39 illustrating the drain current versus drain voltage characteristic of the transistor of FIGURE 1 for different values of gate-to-source voltage. A feature of an insulated-gate field-effect transistor is that the zero bias characteristic can be at any of the curves 30–39. In FIGURE 4 the curve 37 corresponds to the zero bias gate-to-source voltage. Curves 38 and 39 represent positive gate voltages relative to the source, and the curves 30–36 represent negative gate voltages relative to the source.

The location of the zero bias curve is selected during the manufacture of the transistor, i.e., by controlling the time or the temperature, or both, during the step of the process in which the silicon dioxide layer 28, shown in FIGURES 1 and 2, is grown. This inversion layer or channel is formed during the growth of the silicon dioxide layer 28. The longer the transistor is baked and the higher the temperature in a reducing gas atmosphere the larger the drain current will be for a given amount of drain voltage at zero bias between the source and gate electrodes.

Reference is now made to FIGRE 5 of the drawings which shows an equivalent circuit diagram of the transistor shown in FIGURE 1. The input impedance of the transistor can be represented by a resistance $R_1$ connected in parallel with a series circuit including a capacitor $C_2$ and a resistor $R_2$. The input impedance is measured between the gate electrode 22 and the source electrode 16. The gate electrode 22 is coupled to the drain electrode 24 through a capacitor $C_3$, which is the intrinsic feedback capacitance between the gate and drain electrodes 22 and 24, and a resistor $R_3$ which represents the unmodulated component of the channel resistance.

A constant current generator having a value equal to $g_mE_g$ is coupled between the source electrode 16 and the junction of the capacitor $C_3$ and the resistor $R_3$. $g_m$ is the value of transconductance of the transistor 10 and $E_g$ is the applied gate-to-source signal voltage. During the investigation of circuits, such as amplifiers and oscillator circuits for example, which employed insulated-gate field-effect transistors and which were used at high frequencies, the gain and hence the signal-to-noise ratio of these circuits was found to decrease as the frequency of operation was increased. One factor which appeared to limit the frequency response of the circuit was the capacitive output impedance of the transistor itself measured between the drain and source electrodes and which is illustrated in the equivalent circuit of FIGURE 5 including the resistor $R_4$ connected in parallel with the series combination of a capacitor $C_5$ and a resistor $R_5$.

The typical values of the elements of the equivalent circuit are shown in FIGURE 5 and they correspond to the values obtained from a typical insulated-gate field-effect transistor similar to the one shown in FIGURE 1.

The values of capacitance are given in micromicrofarads, that is, picofarads (pf.) and the values of resistance are given in ohms ($\Omega$) or kilohms ($K\Omega$) as indicated in FIGURE 5. The resistance $R_5$ corresponds to the bulk resistance exhibited by the substrate between the drain substrate rectifying junction $D_1$, shown in FIGURE 3, and the header 29.

By reducing the magnitude of the resistance $R_5$, the Q of the capacitance $C_5$ is enhanced which results in improved operation of the device at ultra-high frequencies (especially at the high frequency end of the UHF range).

To explain the effect of the capacitance $C_5$-resistance $R_5$ in a practical circuit operable at UHF, an inductor L and a capacitor C are shown connected between the drain electrode 24 and the source electrode 16 in FIGURE 5.

The capacitor C, which in conjunction with the capacitor $C_5$ tunes the inductor L, is selected to have a value such that the inductor L has a practical value of inductance at the desired frequency of resonance. This results (for a given inductor) in a value of capacitance that is much larger than the capacitance $C_5$ at the low frequency end of the UHF range, and a comparable value of capacitance at the high frequency end of the UHF range. Clearly, at the low frequency end of the UHF range the inductor L is tuned by the capacitor C almost entirely, i.e., the capacitance $C_5$ represents a very small amount of the total capacitance tuning the inductor L, and hence a negligible amount of current flows through the resistance $R_5$-capacitance $C_5$ path whereby the Q of the circuit is primarily determined by the resistance $R_4$. At the high frequency end of the UHF range, however, the capacitance of the capacitor C more closely approaches the value of the capacitance $C_5$ whereby the capacitance $C_5$ has a greater effect in tuning the inductor L, i.e., a greater portion of the total resonant circuit current flows through the capacitance $C_5$-resistance $R_5$ path, and hence the resistance $R_5$ has a greater effect on the Q of the circuit; i.e., the larger $R_5$ the lower the Q of the circuit.

A device which exhibits a low value for the resistor $R_5$ is shown in FIGURE 6, which is a cross sectional view similar to the cross sectional view shown in FIGURE 2. The process involved in manufacturing the transistor shown in FIGURE 6 is similar to the process described in connection with FIGURE 1, with the exception that the body 12 of semiconductor material is heavily doped silicon, that is, silicon having a resistivity of less than 0.5 ohm-cm. In this example, body 12 is made of .01–.05 ohm-cm. material. An epitaxial layer $\mathbf{12_a}$ of high resistivity semiconductive material, that is, having an electrical resistivity more than 10 ohm-cm.; is deposited on one major surface of the body 12 by a well-known technique. This may be done, for example, by passing vaporized silicon tetrachloride ($SiCl_4$) mixed with suitable doping ingredients over the surface of the body 12 at high temperatures, such as 1,000–1,200 degrees centigrade, for example.

The thickness of the epitaxial layer $\mathbf{12_a}$ is much smaller than the thickness of the body 12. For example, the thickness of the epitaxial layer $\mathbf{12_a}$ is approximately between 10,000 and 100,000 Angstroms, and the thickness of the body 12 is equal to 5 mils or 1,270,000 Angstroms approximately. By depositing epitaxially a layer of lightly doped P-type material $\mathbf{12_a}$ with an approximate resistivity of 100 ohm-cm. on the heavily doped P-type base layer 12 having a resistivity between .01 to .05 ohm-cm., a uniform composite crystal is obtained (the equivalent of a single crystal) and the doping of the resulting epitaxial layer is uniform. The thickness of the base layer is determined by ruggedness considerations of the device, i.e., the minimum required thickness with which a device could be used practically. Furthermore, the substrate of the transistor is not made completely of heavily doped material, because the magnitude of the required gate-to-source voltages for successful operation of the device would be greatly increased.

The resistance exhibited between the drain P–N junction $D_1$ and the header 29 by the composite substrate shown in FIGURE 6 is much smaller than the bulk resistance exhibited by the substrate 12 of the transistor shown in FIGURE 1. This results in a device that provides improved operation at UHF. The value of the resistance $R_5$ shown in the equivalent circuit in FIGURE 5 for the device illustrated in FIGURE 6 in the circuit of FIGURE 7 is approximately 5–10 ohms (as compared to 100 ohms for the device of FIGURES 1 and 2) and accordingly the effect of the output series resistance $R_5$ on the Q of a tuned output circuit is reduced.

It should be noted that the diagrammatic representation of the transistor illustrated in FIGURE 6 is disproportionate; i.e., the relative dimensions of the semiconductor layers 12 and $\mathbf{12_a}$ are shown out of proportion for reasons of simplicity of illustration. In reality the layer 12 is approximately ten times thicker than the layer $\mathbf{12_a}$.

Also in practice, the source and drain regions S and D are diffused 1 to 3 microns into the epitaxial layer $\mathbf{12_a}$. Care should be taken, however, in the design of the transistor so that the distance *d* between the diffused drain region D and the base layer 12 is such that the drain depletion layer at the maximum operating voltage does not reach the base layer 12, because that would increase the capacitance of capacitor $C_5$ and would decrease the breakdown voltage of the transistor.

Reference is now made to FIGURE 7 of the drawings in which an ultra high frequency signal translating circuit embodying the invention is shown. A transistor 40 similar to the transistor shown in FIGURE 6 is connected as the active device of the amplifier circuit. Input signals are coupled from a signal source (not shown) through a coupling capacitor 42 between the gate electrode 44 and the source electrode 46 of the transistor 40. The capacitor 42 is shown connected to the inner conductor of a co-axial cable 43 which in turn would be connected to the source of input signals. The outer conductor of the co-axial cable 43 is connected to a point of reference potential shown as ground.

The source electrode 46 of transistor 40 is also connected to ground. A gate-to-source bias voltage is coupled through a resistor 48 to the gate electrode 44. A feed through capacitor 50 connested to the resistor 48 bypasses signal frequencies to ground. A transmission line conductor 52 is connected to the drain electrode 54 of the transistor 40 at one end thereof. The elements comprising the circuit shown in FIGURE 7 may be enclosed in a conductive chassis (not shown), for example, and which may constitute the ground plane to form in conjunction with the transmission line conductor 52 the resonant transmission line 56. A variable capacitor 58 is connected between the opposite end of the transmission line 56 and ground to tune the transmission line 56 to a desired frequency. A source of operating potential, not shown, is applied between the drain and source electrodes 54 and 46 through a radio frequency choke 60. Output signals are derived by means of a coupling link 62 which is inductively coupled to the transmission line conductor 52. In this embodiment, the transistor is connected in a common-source configuration, with the gate electrode serving as the input electrode and the drain electrode serving as the output electrode. The coupling link 62 is connected between the inner conductor of a coaxial cable 61 and ground. The outer conductor of the coaxial cable 61 is also grounded. The coupling link 62 may comprise a section of transmission line conductor having a portion parallel to and in proximity of the transmission line conductor 52.

The substrate electrode 63, which corresponds to the header 29 shown in FIGURE 6 of the drawings, is connected to the source electrode 46 of the transistor 40 and is thereby connected to ground. The resistance $R_5$, exhibited by the transistor 40 as shown in FIGURE 5, is mostly due to the resistance exhibited by the base layer 12 and as a result it is a small resistance in the order of 5–10 ohms. If the header 29, and hence the substrate of the transistor 40 is not grounded, additional resistance is added in the output path due to the resistance of the source-substrate rectifying junction $D_2$ shown in FIGURE 2, which results in an increased $R_5$.

In operation, the capacitor 58 tunes the transmission line to the desired frequency. As previously pointed out the transistor 40 has a capacitance $C_5$-resistance $R_5$ series network in its output impedance (shown in FIGURE 5). The frequency of resonance of the circuit is thereby determined by the joint action of both the capacitor 58 and the capacitance $C_5$. At the high frequency end of the band, capacitance $C_5$ contributes a substantial amount of the total capacitance in the resonant circuit. Because the resistance $R_5$ is relatively small, the effective Q of the circuit at the high frequency end of the band remains relatively large.

As shown in FIGURE 7, the load of the circuit is represented by a coaxial cable 61. To obtain maximum power transfer the output impedance of amplifier should be matched to the load. In cases of tunable amplifiers the load should be substantially matched for optimum operation, throughout the range of operation. Utilizing a transistor such as the one shown in FIGURE 1, would result in a considerable mismatch at the high frequency end of the band (of the order of 1 kmc.) due to the effect of the resistor $R_5$ in the output impedance of the circuit. Employing the transistor shown in FIGURE 6, however, results in a considerable improvement in the operation of the circuit at the high frequency end of the band; i.e., the load mismatch is not as severe, whereby substantial matching of the load to the resistor $R_4$ is possible and hence maximum power transfer throughout the frequency band of operation is attained.

The amplifier circuit shown in FIGURE 7 may comprise the radio frequency amplifier of a UHF television tuner, for example, operable throughout the UHF television band. Although an amplifier circuit is illustrated embodying the invention, UHF converter and oscillator circuits may also embody the present invention. The signal translating circuit illustrated in FIGURE 7 includes a field-effect transistor connected in the common source configuration. The transistor may alternatively be connected in the common base configuration.

What is claimed is:

1. An electrical circuit operable at ultra-high frequencies comprising in combination:

an insulated-gate field-effect transistor having source and drain electrodes in an epitaxial layer of doped semiconductor material on a base layer of more highly doped semiconductor material and forming a combined substrate therewith and a gate electrode insulated from said epitaxial layer;

circuit means for connecting said gate, source and drain electrodes of said transistor so that said transistor operates as the active device of said electrical circuit; and resonant circuit means connected between said source and drain electrodes and cooperating with said combined substrate to provide improved operation at said ultra-high frequencies.

2. An ultra high frequency signal translating circuit tunable over a range of frequencies including:

an insulated-gate field-effect transistor having input, output and common electrodes and having a substrate of doped semiconductor material, sail substrate being epitaxially grown on a base layer of more highly doped semiconductor material to form with said base layer a composite substrate for said field-effect transistor, said composite substrate exhibiting a relatively small resistance between said output electrode and said composite substrate;

means for connecting said input, output and common electrodes as a signal translating circuit;

means for applying input signals between said input and common electrodes; and an output circuit exhibiting a predetermined impedance connected between said output and common electrodes for deriving output signals including a transmission line and a tuning capacitor connected at one end thereof.

3. A tuned ultra high frequency amplifier circuit comprising:

an insulated-gate field-effect transistor having gate, drain and source electrodes and having a substrate of doped semiconductor material, said substrate being epitaxially formed on a base layer of more highly doped semiconductor material to form with said base layer a composite substrate for said field-effect transistor, said composite substrate exhibiting a relatively small resistance between said drain electrode and said composite substrate;

means for connecting said gate, source and drain electrodes of said transistor as an amplifier;

means for applying input signals between said gate and source electrodes;

a series output circuit including a resonant transmission line and a tuning capacitor connected at one end thereof between said drain and source electrodes for deriving output signals;

load circuit means exhibiting a predetermined impedance; and inductive coupling means between said output circuit and said load means for coupling output signals from said amplifier circuit to said load.

4. An ultra high frequency circuit comprising in combination:

an insulated-gate field-effect transistor including a crystalline semiconducting wafer having two opposing faces, the electrical resistivity of said wafer being about .01 to .05 ohm-cm., an epitaxial of crystalline semiconductive material about 10,000 to 100,000 Angstroms thick on one said face of said wafer and forming a combined substrate therewith, the electrical resistivity of said epitaxial layer being about 100 ohm-cm., source and drain electrode regions on said epitaxial layer, said regions having a gap therebetween and the thickness of said regions being less than the thickness of said epitaxial layer, an insulating layer on said epitaxial layer over said gap, and an electrode for each of two electrode regions and on said insulating layer over said gap;

means coupled to the electrodes corresponding to said source and drain electrode regions and to the electrode on said insulating layer over said gap to connect said transistor in a common source configuration;

an inductive network including a load having a predetermined impedance connected between said drain and source electrodes and cooperating with said combined substrate to provide improved operation at ultra-high frequencies; and means for applying an operating potential between said drain and source electrodes.

5. An ultra high frequency circuit comprising in combination:

an insulated-gate field-effect transistor having gate source and drain electrodes, said source and drain electrodes being in an epitaxial layer of doped semiconductor material, said epitaxial layer being grown on a base layer of more highly doped semiconductor material;

means for connecting said gate, source and drain electrodes so that said transistor operates as the active device of said ultra high frequency circuit;

means connected between said gate and source electrodes for biasing said transistor to a desired point in its current-voltage characteristic;

a tuned output circuit including a resonant transmission line and a tuning capacitor connected between said drain electrode and one of said gate and source electrodes;

means coupled between said drain electrode and one of said gate and source electrodes for applying an operating potential;

means inductively coupled to said transmission line to derive output signals; and means for coupling said layer of more highly doped semiconductor material to one of said source and gate electrodes.

6. An ultra high frequency electrical circuit comprising in combination:

an insulated-gate field-effect transistor comprising a low electrical resistivity crystalline semiconductive layer having two opposing faces, an epitaxial layer of high resistivity semiconductive material on one said face of said wafer and forming a combined substrate therewith, source and drain electrode regions on said epitaxial layer, said regions having a gap therebetween and the thickness of said regions being less than the thickness of said epitaxial layer, an insulating layer on said epitaxial layer over said gap, and a gate electrode on said insulating layer;

circuit means for connecting said gate, source and drain electrodes of said transistor so that said transistor operates as the active device of said electrical circuit;

inductive circuit means coupled between said drain electrode and one of said gate and source electrodes for utilizing signals derived from said transistor and cooperating with said combined substrate to provide improved operation at ultra-high frequencies; and means for coupling said low electrical resistivity crystalline semiconductive wafer to the other one of said gate and source electrodes.

7. A tuned ultra high frequency electrical circuit comprising in combination:

an insulated-gate field-effect transistor having gate, source and drain electrodes, said drain and source electrodes being in an epitaxial layer of doped semiconductor material formed on a base layer of more highly doped semiconductor material and forming a combined substrate therewith;

input circuit means coupled between said gate and source electrodes for receiving an input signal;

inductive circuit means coupled between said drain electrode and one of said gate and source electrodes to provide in conjunction with the output impedance of said transistor a tuned output circuit and cooperating with said combined substrate to provide improved operation at ultra-high frequencies;

means for applying an operating potential between said drain and said one of said gate and source electrodes; and means for coupling said layer of more highly doped semiconductor material to the other of said gate and source electrodes.

8. In combination:

an insulated-gate field-effect transistor operable at ultra-high frequencies comprising a crystalline semiconductive wafer having two opposing faces, the electrical resistivity of said wafer being less than 0.5 ohm-cm., an epitaxial layer of crystalline semiconductive material on one said face of said wafer and forming a combined substrate therewith, the electrical resistivity of said epitaxial layer being more than 50 ohm-cm., source and drain electrode regions in said epitaxial layer, said regions having a gap therebetween and the thickness of said regions being less than the thickness of said epitaxial layer, an insulating layer on said epitaxial layer over said gap, and an electrode on each of said two electrode regions and on said insulating layer over said gap;

input circuit means coupled between the electrode corresponding to said source electrode region and the electrode on said insulating layer over said gap, for applying input signals having a predetermined frequency;

an output circuit resonant at said predetermined frequency coupled between the electrode corresponding to said drain electrode region and one of the other two electrodes; and means coupled between said semiconductive wafer and said one of said other two electrodes to reference said wafer to the potential of said other electrode, whereby the resistivity characteristic of said combined substrate provides improved operation at said ultra-high frequencies.

9. An ultra high frequency circuit comprising in combination:

an insulated-gate field-effect transistor having gate, source and drain electrodes, said drain and source formed in a layer of doped semiconductor material, said layer of doped semiconductor material being epitaxially grown on a base layer of more highly doped semiconductor material;

input circuit means connected between said gate and source electrodes;

output circuit means including a resonant transmission line and a capacitor to tune said transmission line coupled between said drain electrode and one of said source and gate electrodes;

load circuit means inductively coupled to said transmission line; and means for coupling said base layer of semiconductor material to one of said source and gate electrodes so that said output circuit means and said load means are substantially matched.

10. An insulated-gate field-effect transistor operable at ultra high frequencies comprising a low electrical resistivity crystalline semiconductive wafer having two opposing faces;

an epitaxial layer of high resistivity semiconductive material on one said face of said wafer and forming a combined substrate therewith;

source and drain electrode regions in said expitaxial layer, said regions having a gap therebetween and the thickness of said regions being less than the thickness of said epitaxial layer;

an insulating layer on said epitaxial layer over said gap; and a gate electrode on said insulating layer, whereby the resistivity characteristic of said combined substrate provides improved operation at said ultra-high frequencies.

11. An insulated-gate field-effect transistor operable at ultra high frequencies comprising a crystalline semiconductive wafer having two opposing faces, the electrical resistivity of said wafer being less than 0.5 ohm-cm.;

an epitaxial layer of crystalline semiconductive material on one said face of said wafer and forming a combined substrate therewith, the electrical resistivity of said epitaxial layer being more than 50 ohm-cm.;

source and drain electrode regions in said epitaxial layer, said regions having a gap therebetween and the thickness of said regions being less than the thickness of said epitaxial layer;

an insulating layer on said epitaxial layer over said gap; and an electrode on each of said two electrode regions and on said insulating layer over said gap, whereby the resistivity characteristic of said combined substrate provides improved operation at said ultra-high frequencies.

12. An insulated-gate field-effect transistor operable at ultra-high frequencies comprising a crystalline semiconductive wafer having two opposing faces, the electrical resistivity of said wafer being about .01 to .05 ohm-cm.;

an epitaxial layer of crystalline semiconductive material about 10,000 to 100,000 Angstroms thick on one said face of said wafer and forming a combined substrate therewith, the electrical resistivity of said epitaxial layer being about 100 ohm-cm.;

source and drain electrode regions in said epitaxial layer, said regions having a gap therebetween and the thickness of said regions being less than the thickness of said epitaxial layer;

an insulating layer on said epitaxial layer over said gap; and an electrode on each of said two electrode regions and on said insulating layer over said gap, whereby the resistivity characteristic of said combined substrate provides improved operation at said ultra-high frequencies.

13. An electrical circuit operable at ultra-high frequencies comprising in combination:

an insulated gate field effect transistor having input, output and common electrodes and having a substrate of doped semiconductor material, said substrate being epitaxially grown on a base layer of more highly doped semiconductor material to form with said base layer a composite substrate for said field effect transistor, said composite substrate exhibiting a relatively small resistance between said output electrode and said composite substrate;

means for connecting said input, output and common electrodes as a signal translating circuit;

means for applying input signals between said input and common electrodes; and a resonant circuit connected between said output and common electrodes for deriving output signals, whereby the resistivity characteristic of said combined substrate provides improved operation at said ultra-high frequencies.

References Cited by the Examiner

UNITED STATES PATENTS

| | | | |
|---|---|---|---|
| 2,863,056 | 12/1958 | Pancove | 317—234 |
| 2,870,413 | 1/1959 | Cluwen | 317—234 |
| 3,177,100 | 4/1965 | Mayer et al. | 317—235 |
| 3,229,120 | 1/1966 | Carlson | 207—88.5 |

OTHER REFERENCES

Proceedings of the IEEE—A Unipolar Structure Applying Lateral Diffusion, by Roosild et al., pp. 1059–1060 of the July 1963 edition.

ARTHUR GAUSS, *Primary Examiner.*

J. HEYMAN, *Assistant Examiner.*